US009208971B2

(12) United States Patent
Sellers

(10) Patent No.: US 9,208,971 B2
(45) Date of Patent: Dec. 8, 2015

(54) KEYBOARD INSERT

(75) Inventor: Charles A. Sellers, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1067 days.

(21) Appl. No.: 13/254,895

(22) PCT Filed: Mar. 4, 2009

(86) PCT No.: PCT/US2009/036055
§ 371 (c)(1),
(2), (4) Date: Sep. 6, 2011

(87) PCT Pub. No.: WO2010/101567
PCT Pub. Date: Sep. 10, 2010

(65) Prior Publication Data
US 2012/0001775 A1 Jan. 5, 2012

(51) Int. Cl.
*H01H 13/70* (2006.01)
*H01H 3/04* (2006.01)
*H01H 3/20* (2006.01)
*B41J 5/00* (2006.01)
*B41J 29/12* (2006.01)
*H03K 17/94* (2006.01)
*H01H 13/705* (2006.01)
*H01H 3/12* (2006.01)

(52) U.S. Cl.
CPC ............. *H01H 13/705* (2013.01); *H01H 3/122* (2013.01); *H01H 2203/008* (2013.01); *H01H 2221/054* (2013.01); *H01H 2221/076* (2013.01)

(58) Field of Classification Search
CPC ......... H01H 3/122; H01H 13/705; B41J 5/14; B41J 5/16
USPC ........................................... 200/344; 400/496
See application file for complete search history.

(56) References Cited

U.S. PATENT DOCUMENTS

| | | | | |
|---|---|---|---|---|
| 4,412,754 A | | 11/1983 | Sparks | |
| 6,100,482 A | * | 8/2000 | Koma et al. | 200/344 |
| 6,140,595 A | * | 10/2000 | Yao | 200/344 |

FOREIGN PATENT DOCUMENTS

| | | |
|---|---|---|
| CN | 2444273 | 8/2001 |
| JP | 1179331 | 12/1989 |
| JP | 04004530 | 1/1992 |
| JP | 2599321 | 9/1999 |
| JP | 2001222925 | 8/2001 |

OTHER PUBLICATIONS

International Search Report and Written Opinion, Appln. No. PCT/US2009/036055, date of mailing, Dec. 7, 2009, 10 p.

* cited by examiner

*Primary Examiner* — Firmin Backer
*Assistant Examiner* — Jerold Murphy
(74) *Attorney, Agent, or Firm* — Conley Rose

(57) ABSTRACT

An insert for a keyboard comprises a molded body that comprises a pair of opposing sides. Each of the opposing sides has a groove that extends along at least a portion of the respective side. Each groove is adapted to receive a leveling wire from a keycap.

10 Claims, 2 Drawing Sheets

KEYBOARD INSERT

BACKGROUND

Keyboards have keys of varying sizes. The alphanumeric keys (A, B, C, 1, 2, 3, etc.) typically are relatively small. Other keys, such as the tab key, shift key, the space bar, etc.) are wider than the alphanumeric keys. Such wider keys often have a leveling mechanism that causes the entire key to move down in a level fashion when pressed, not just in the center of the key, but also at one side of the key or the other. Without such a leveling mechanism, a wide key may rock about its center electrical contact, similar to the motion of a teeter totter, when pressed off-center.

Leveling mechanisms for keyboard keys unfortunately involve two metal surfaces contacting each other and may result in a metallic "clicking" sound that may be bothersome. Further, manufacturing at least some metal-based leveling mechanisms can be problematic due to the relatively small dimensions involved.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

The terms "key" and "key cap" are synonymous in this disclosure. The terms "keyboard" and "keyboard assembly" are also synonymous.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
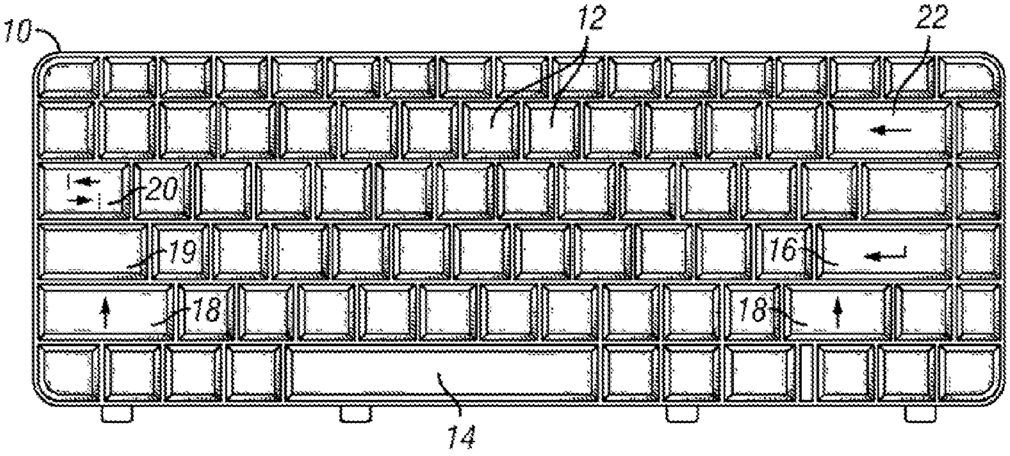
FIG. 1 shows a keyboard in accordance with various embodiments.

FIG. 1 shows a top view of a keyboard assembly 10 in accordance with various embodiments. The layout of the various keys can be different from that shown. Some keys, such as keys 12, are relatively narrow. Such keys include the alphanumeric keys (A, B, C, 1, 2, 3, etc.). Other keys are wider than the alphanumeric keys and include, for example, the space bar 14, the enter key 16, the shift keys 18, the caps lock key 19, the tab key 20, the backspace key 22, etc. One or more of such wider keys use the leveling mechanism disclosed herein. In accordance with at least some embodiments, the keys 12-22 are made of plastic or other suitable material.

Figure 2:
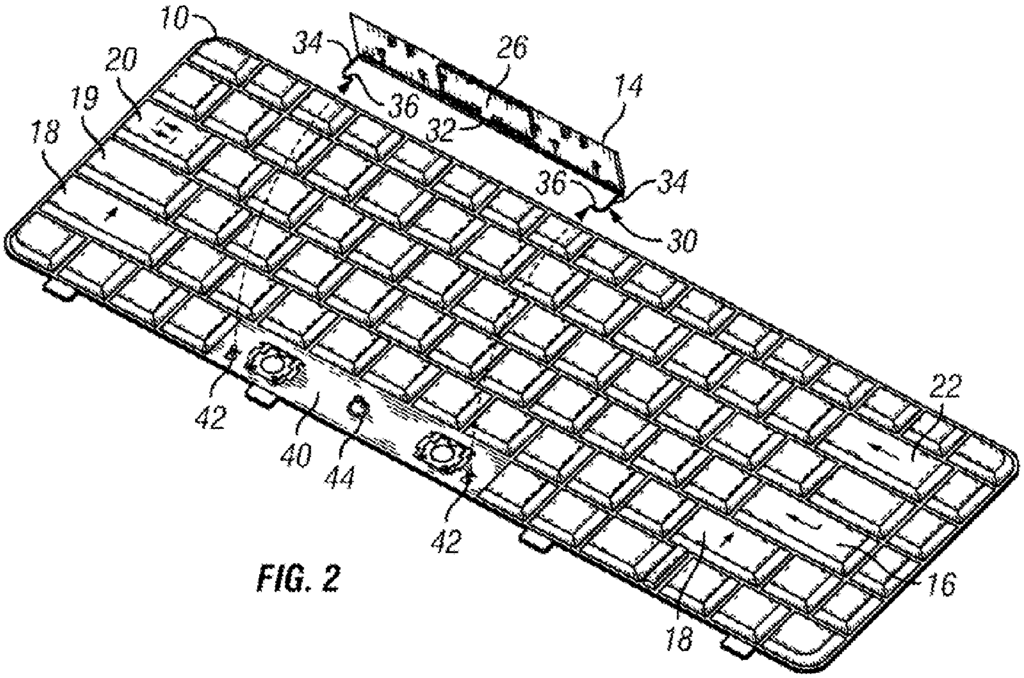
FIG. 2 shows the keyboard of FIG. 1 with one of the wider keys (space bar) removed to show the disclosed leveling mechanism in accordance with various embodiments.

FIG. 2 shows a perspective view of keyboard assembly 10 with the space bar 14 removed so as to show the underneath surface 26 of the space bar. A leveling wire 30 is mated to the underneath surface 26 of the space bar 14. The leveling wire 30 is made from metal in accordance with at least some embodiments. The wire 30 comprises a unitary metal member formed into a shape comprising a longitudinal portion 32 that mates to the surface 26 of the space bar and two opposing leg portions 34 formed at generally right angles to the longitudinal portion 32. The end 36 of each leg portion 34 is formed at a right angle to the leg portion 34 as shown.

The keyboard assembly 10 comprises a base surface 40 from which various features are formed or otherwise attached. Surface 40 is made from metal in accordance with various embodiments. In FIG. 2, the space bar 14 has been removed to illustrate the disclosed leveling mechanism. The disclosed mechanism may apply to one or more other keys, such as the wide keys (enter key 16, shift keys 18, caps lock key 19, tab key 20, backspace key 22, etc.). One of the features provided on the base metal surface 40 for the space bar 14 is an electrical contact actuator 44. As the space bar 14 is pressed downward, the space bar 14 presses down on actuator 44 which, when deflected downward far enough, causes two electrically conductive members to contact each other. Without the leveling mechanism described herein, the space bar 14 may rock about actuator 44 when pressed on the left or right sides of the key.

The leveling mechanism of various embodiments comprises the leveling wire 30 and two plastic inserts 42 provided on the base metal surface 40. The angled ends 36 of the leveling wire 30 hook into corresponding grooves in the plastic inserts 42. Accordingly, as one side of the space bar 14 is pressed downward, the opposite end will tend to lift upward due to the rocking motion about the actuator 44. However, the opposing, upwardly lifting end is held in place by the leveling wire whose angled end 36 inserted into the plastic insert 42 prevents such opposing end from actually lifting up, or from lifting up more than a predetermined amount.

The inserts 42 are molded from plastic to thereby form a molded body in at least some embodiments. The angled end 36 of the leveling wire is metal. As the angled ends 36 contacts and presses against the insert's plastic material, the sound of the metal angled end 36 is muffled against the plastic of the insert. From a manufacturing perspective, tolerances for a plastic part can be more tightly controlled than for a metal part so the clearance can be minimized between the metal wire angled end 36 and the groove 56 in the insert 42.

Figure 3:
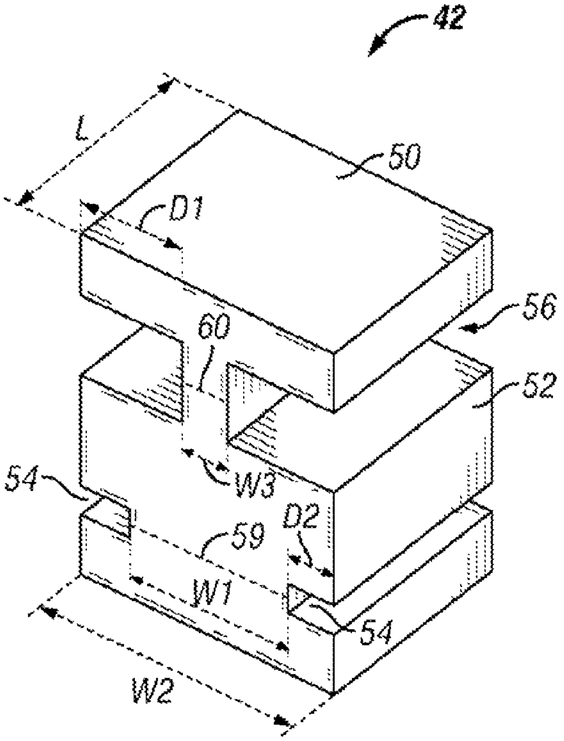
FIG. 3 shows a plastic insert to retain a leveling wire in accordance with various embodiments.

FIG. 3 illustrates a close-up, perspective view of one of the disclosed plastic inserts 42. The plastic insert 42, in accordance with various embodiments, is generally rectangular (which includes square) when viewed from above. Thus, top surface 50 is rectangular. The plastic insert 42 comprises a pair of opposing sides 52 and each side has a pair of grooves 54 and 56. Grooves 54 on each side 52 generally align with each other, as is the case with grooves 56, as indicated by dashed lines 59 and 60, respectively. As shown in the illustrative embodiment of FIG. 3, grooves 56 are deeper than grooves 54. In at least some embodiments, the depth D1 of grooves 56 is in the range of 2 mm to 3 mm and the depth D2 of grooves 54 is in the range of 0.5 mm to 0.6 mm. In FIG. 3, the distance between the lower grooves 54 is designated as W1 and the length of the base between the opposing sides 52 is designated as W2. Further, the distance between the upper grooves 56 is designated as W3. In accordance with at least some embodiments, W1 is in the range of in the range of 5 mm to 6 mm, W2 is in the range of in the range of 6 mm to 7 mm, and W3 is in the range of in the range of 1 mm to 1.5 mm.

Each lower groove 54 extends at least a portion of the way along length L of side 52. In some embodiments, each groove 54 extends the entire length L of side 52. Similarly, each groove 56 extends at least a portion of the way along length L of side 52. In some embodiments, each groove 56 extends the entire length L of side 52.

Opposing grooves 54 are used to retain the plastic insert in place on the base metal surface 40 of the keyboard assembly 10. Each of the opposing grooves 56 is configured to receive an angled end 36 of a leveling wire 30. In various embodiments, when the plastic insert 42 is in use and mated to a keyboard 10, only one of the grooves 56 is used to receive an angled end 36 of a leveling wire 30. Two grooves 56 are provided on opposing sides 52 of the plastic insert 42 to enable the plastic insert to be usable on either side of the key to thereby receive either angled end 36 of the leveling wire. That is, two identical plastic inserts 42 can be mated to the keyboard 10 for receiving the angled ends 36 of the leveling wire 30.

Figure 4:
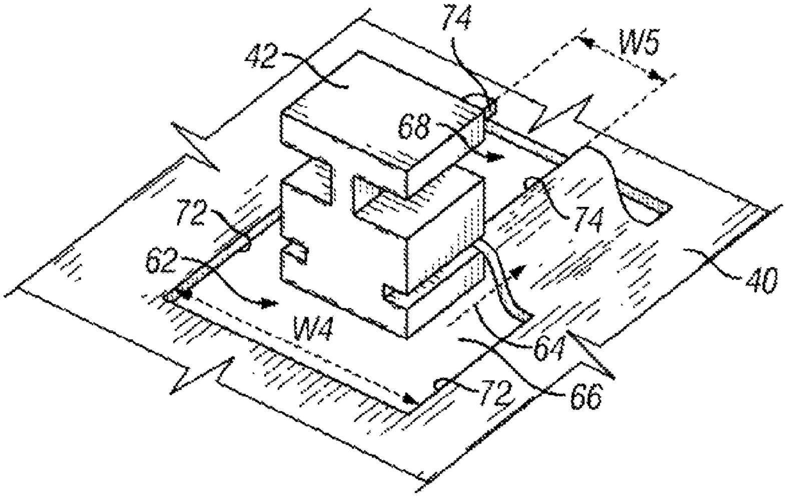
FIG. 4 illustrates how the plastic insert is mated to the keyboard in accordance with various embodiments.

FIG. 4 illustrates the installation of the plastic insert 42 into the base metal surface 40 of the keyboard 10. A hole 62 is cut, or otherwise provided in the base metal surface 40 in the shape shown in accordance with at least some embodiments. The disclosed hole 62 has a wider opening portion 66 and a narrower opening portion 68. The width of the wider opening portion 66 between edges 72 is designated as W4 and the width of the narrower opening portion 68 between edges 74 is designated as W5. Width W4 is larger than width W5. Width W4 should be at least equal to or larger than dimension W2 for the plastic part to be able to be inserted into the wider opening portion 66. Width W5 can be within a range of dimensions between W1 and W2. If W5 was smaller than W1, the plastic insert 42 would not fit into the narrower opening portion 68 and if W5 was larger than W2, the plastic part would fall through the opening and/or not be able to be held in place at all.

Figure 5:
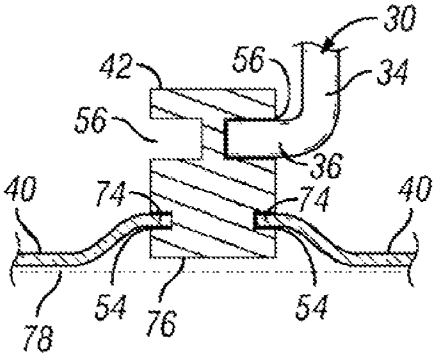
FIG. 5 shows a cross-sectional side view of the plastic insert installed in the keyboard in accordance with various embodiments.

FIG. 5 shows a cross-sectional side view of the plastic insert 42. The plastic insert 42 is shown installed in narrower opening portion 68 of the base metal surface 40 of the keyboard 10. The edges 74 of the opening 68 fit within lower grooves 54. An angled end 36 of a leveling wire 30 is shown inserted into one of the upper grooves 56. The edges 74 of the base metal surface 40 are bent upward slightly in some embodiments to avoid the bottom surface 76 of the plastic insert 42 from being below the plane 78 defined by the base metal surface 40 to thereby not interfere with any components that might be below the keyboard 10 in a system containing the keyboard. In other embodiments, the edges 74 are not bent upward.

Figure 6:
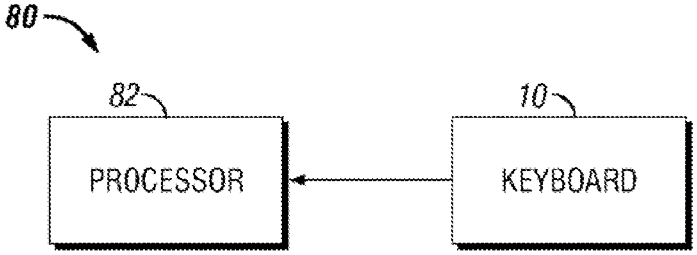
FIG. 6 shows a system comprising the disclosed keyboard in accordance with various embodiments.

FIG. 6 shows a system 80 comprising a processor 82 coupled to keyboard 10. The keyboard 10 in this embodiment provides input to the processor. The keyboard 10 comprises one or more of the plastic inserts 42 described above for retaining a leveling wire 30.

In some embodiments, only a single key on the keyboard 10 contains a plastic insert 42, or pair of plastic inserts. In other embodiments, more than one key comprises one or more plastic insets 42. In still other embodiments, all keys on the keyboard comprise one or more plastic inserts.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:

a processor:

a keyboard coupled to said processor, said keyboard comprising a keycap and a base metal surface and a plastic insert on each of opposing sides of an electrical contact, each plastic insert coupled to said base metal surface via an opening in said base metal surface;

wherein each plastic insert includes a pair of opposing sides and each side comprises a plurality of grooves, a first groove of each of said plurality of grooves on each opposing side to receive a leveling wire from the keycap and a second groove of said plurality of grooves to receive an edge of the base metal surface to couple the plastic insert to said metal surface.

2. The system of claim 1 wherein said plastic insert has another groove along said side for receiving edges of the metal plate.

3. The system of claim 1 wherein each of the plurality of grooves extends along an entire length of its respective side.

4. The system of claim 1 wherein each of the first and second grooves on each opposing side has a depth, and wherein the depth of the first groove is larger than the depth of the second groove.

5. The system of claim 4 wherein the depth of the first grooves on the opposing sides is the same, and wherein the depth of the second grooves on the opposing sides is the same.

6. A keyboard assembly, comprising:

a keycap;

a leveling wire coupled to said keycap;

a base metal surface having an opening; and a plurality of plastic inserts coupled to said base metal surface on opposing sides of an electrical contact via an opening in said base metal surface, each of said plastic inserts comprising two sides each side including a pair of grooves extending along at least a portion of a side of said of said plastic insert;

wherein, of the pair of grooves on each side of each plastic insert, one of such grooves is to receive an end of said leveling wire and the other of such grooves is to receive an edge of said base metal surface to couple said plastic insert to said base metal surface.

7. The keyboard assembly of claim 6 wherein said leveling wire is metal.

8. The keyboard assembly of claim 6 wherein each groove extends along an entire length of said side.

9. An insert for a keyboard, comprising:

a molded body that comprises a pair of opposing sides, a first pair of grooves and a second pair of grooves, each of the first pair of grooves to receive a leveling wire from a keycap and each of the second pair of grooves to receive the insert into a hole of a base member of a keyboard;

wherein each of the first and second pairs of grooves extends along an entire length of the respective side;

wherein each of the first pair of grooves is provided on the opposing sides of the molded body and each of the second pair of grooves is also provided on the opposing sides of the molded body; and wherein the first pair of grooves has a first groove depth and the second pair of grooves has a second groove depth, the first groove depth being different than the second groove depth.

10. The insert of claim 9 wherein the insert is plastic.

* * * * *

UNITED STATES PATENT AND TRADEMARK OFFICE

CERTIFICATE OF CORRECTION

PATENT NO. : 9,208,971 B2
APPLICATION NO. : 13/254895
DATED : December 8, 2015
INVENTOR(S) : Sellers It is certified that error appears in the above-identified patent and that said Letters Patent is hereby corrected as shown below:

In the claims

Column 4, line 56, Claim 6, delete “sides” and insert -- opposing sides, --, therefor.

Column 4, line 58, Claim 6, delete “of said plastic” and insert -- plastic --, therefor.

Signed and Sealed this
Twenty-fourth Day of May, 2016

Michelle K. Lee

Michelle K. Lee
*Director of the United States Patent and Trademark Office*